United States Patent [19]

Kudo et al.

[11] Patent Number: 5,595,412
[45] Date of Patent: Jan. 21, 1997

[54] DEVICE FOR HANDLING WAFERS

[75] Inventors: Hideo Kudo; Isao Uchiyama, both of Fukushima-ken, Japan

[73] Assignee: Shin-Etsu Handotai Co., Ltd., Tokyo, Japan

[21] Appl. No.: 352,654

[22] Filed: Dec. 9, 1994

[30] Foreign Application Priority Data

Dec. 10, 1993 [JP] Japan .................................. 5-310299

[51] Int. Cl.$^6$ ...................................................... B66C 1/42
[52] U.S. Cl. ..................... 294/87.1; 414/941; 294/103.1; 294/907
[58] Field of Search ................................ 294/87.1, 103.1, 294/119.1, 907; 414/416, 749, 750, 751, 935, 936, 937, 938, 941

[56] References Cited

U.S. PATENT DOCUMENTS

| | | | |
|---|---|---|---|
| 4,178,119 | 12/1979 | Busch | 294/119.1 |
| 4,801,168 | 1/1989 | Sato | 414/941 |
| 5,007,788 | 4/1991 | Asano et al. . | |
| 5,030,057 | 7/1991 | Nishi et al. . | |
| 5,188,499 | 2/1993 | Tarng et al. | 414/416 |
| 5,374,153 | 12/1994 | Nishi | 414/935 |
| 5,403,057 | 4/1995 | Sugito et al. | 294/119.1 |
| 5,406,092 | 4/1995 | Mokuo | 414/936 |

FOREIGN PATENT DOCUMENTS

| | | |
|---|---|---|
| 526245 | 3/1993 | European Pat. Off. . |
| 5-36667 | 2/1993 | Japan . |
| 5-47729 | 2/1993 | Japan . |

*Primary Examiner*—David A. Bucci
*Assistant Examiner*—Douglas Hess
*Attorney, Agent, or Firm*—Barnes & Thornburg

[57] ABSTRACT

The present invention provides a device for handling wafers with every group of more than one that is built in a cassette-less automatic wafer cleaning apparatus, wherein the group of wafers are washed at a time which does not require very high accuracy in positioning the wafers and may accommodate the wafers of any different diameters, the device for handling wafers comprising: external hollow shafts and internal shafts inserted and freely slidable within the inside of the external hollow shafts; a drive mechanism, wherein each pair of the external hollow shafts and the internal shafts are movable in their respective opposed directions by the same distances with a timing belt and a drive motor for driving the timing belt; a pair of handling members respectively held fast at pairs of ends side by side of each pair of the external hollow shafts and the internal shafts; and a plurality of supporting structures holding the wafers provided on the respective opposed surfaces of handling members.

24 Claims, 8 Drawing Sheets

DEVICE FOR HANDLING WAFERS

BACKGROUND OF THE INVENTION

1. Field of the Invention

This invention relates to a device for handling wafers with every group of more than one that may be built in a cassette-less automatic wafer cleaning apparatus which does not require very high accuracy in positioning the wafers and may accommodate the wafers of different diameters.

2. Description of the Prior Art

In semiconductor device fabrication, semiconductor devices as final product is adversely affected in performance thereof by impurities or foreign matter stuck on the surface of a wafer made of semiconductor single crystal (hereinafter referred to as wafer), which is a starting material for the devices.

A cleaning operation is therefore indispensable in processes for producing wafers. And there are available a variety of cleaning methods in the cleaning operation for a process for producing wafers, which are most broadly classified into the two group of physical methods and chemical methods.

In the physical methods, included are a method in which impurities stuck on the surface of a wafer are directly removed by the mechanical action of a washing brush, another method in which a pressurized liquid is shot in a stream onto part or all of the surface of a wafer from a jet nozzle and thereby the impurities are removed off, and still another method in which impurities stuck on the surface of a wafer are removed off by application of ultrasonic waves (which is the so-called ultrasonic cleaning method).

In the chemical methods, included are methods in which impurities stuck on the surface of a wafer are chemically decomposed into constituents to be removed by the powers of chemicals or enzymes. In the meantime, both of the methods may be combined so as to improve the total cleaning capacity.

A trend of increasingly more complexity of a semiconductor device in recent years demands wafers as starting material of an increasingly larger diameter in semiconductor device fabrication, so that laborious work should be required in a cleaning operation if a conventional method was adopted in which wafers are contained in a plastic cassette as carrier and washed as they are kept therein.

What's more, another problem is brought about that undesirable particles would be stuck onto wafers to pollute due to collision or friction between the wafers and the cassette, which produces the particles in a transportation system where the wafers are contained within the cassette.

The present applicant has proposed a single-wafer type cassette-less automatic wafer cleaning apparatus, which is disclosed in First Publication HEI No. 5-36667, wherein wafers are dealt with one at a time to be entirely immersed into cleaning solutions respectively held in a plurality of cleaning baths for washing. The applicant has also proposed a wafer handling device that is designed to handle wafers with one at a time, which is disclosed in First Publication HEI No. 5-47729.

The above-mentioned single-wafer type cassette-less automatic wafer cleaning apparatus has been well received by those working in the field of the art, since laborious work needed is greatly reduced in comparison with the same needed by a conventional method, wherein a plurality of wafers are contained in a carrier cassette for washing, and on the top of the above merit the conventional wafer pollution problem caused by a carrier cassette itself during transportation is completely settled.

However, the above-mentioned single-wafer type cassette-less automatic wafer cleaning apparatus still have a problem that increase in process efficiency could not be expected very much due to the way of handling wafers one at a time therein.

The inventors have therefore studied in pursuit of increase in process efficiency of the cassette-less automatic wafer cleaning apparatus and as a result reached to the present invention. In the course of the study, a notion has been being kept in mind that a possibility that the process efficiency could be increased by handling wafers with every group of more than one instead of one at a time.

SUMMARY OF THE INVENTION

The present invention has an object to provide a device for handling wafers, characterized in that the device does not require very high accuracy in positioning wafers, may be capable of handling wafers of different diameters, and has a simpler mechanical structure to thereby obtain a lower level of the cost to make on top of higher reliability in the motions of the components, so that the device may materialize an efficient cassette-less automatic wafer cleaning apparatus by being equipped therein and thereby facilitating of handling wafers with every group of more than one.

The present invention was made to solve the problem and to achieve the object. The device for handling wafers according to the present invention comprises: external hollow shafts supported horizontally and movable in the axial direction; internal shafts inserted and freely slidable within the inside of the external shafts; a pair of handling members respectively held fast at ends side by side of each pair of the external hollow shafts and the internal shafts in such a manner that the respective surfaces are opposed to each other; a drive mechanism for moving the external and internal shafts in their respective opposed directions; and a plurality of supporting structures prepared on both of the respective opposed surfaces of the handling members.

It is preferable to move the pair of handling members above-mentioned by the same distances in their respective opposed directions as motion of the device from a view point of wafer handling itself.

A mechanism whereby the pair of handling members are movable in their respective opposed directions may be constructed of: a pair of spacing bars respectively held fast to external and internal shafts at each of the other pairs of the ends of the handling members; a timing belt connecting the external hollow shaft with the internal shaft; and a drive means for driving the timing belt to move both of the shafts.

The handling members each have the form of a spacious plate, which surfaces opposing to each other have supporting structures as is in the shape of a recess (hereinafter referred to as supporting recess). A plurality of slits penetrating the plate are preferably opened adjacent to the supporting recesses each for communicating the liquid directly between both of the sides (hereinafter referred to as liquid communicating slit). Therefore a cleaning solution is quick to be displaced from the space between the handling members when the opposed handling members move toward each other, that is, in the respective directions of closing the interval therebetween and as a result the handling members may avoid a adverse effect of the cleaning solution to resist the motions thereof despite of their disadvantageous planar forms.

Adjustability under control of the respective traveling distances of the external and internal shafts enables the handling members to support wafers of different diameters without any limitation to choice. In the meantime, there are available a variety of techniques as means for regulating the respective traveling distances of both of the shafts in accordance with selection of the different diameters of wafers. For example, a plurality of sensors are usable to regulate the drive means with regard to a number of revolutions by means of a rotary encoder.

According to the present invention, external hollow shafts and internal shafts are translated in their respective opposed directions by energizing a drive means, thereby handling members held fast to both of the shafts are opened or closed, and when being closed, wafers are vertically held by the handling members therebetween as they has been in, for example, a carrier cassette. In the next stage, all the wafers are sequentially immersed in the respective cleaning solutions held in cleaning baths, and finally the wafers are finished with the entire automatic cleaning process with every group of more than one wafer. The above-mentioned series of operations are repeatedly applied to wafers with every group of more than one wafer.

BRIEF DESCRIPTION OF THE DRAWINGS

The novel features which are considered characteristic of the present invention are set forth with particularity in the appended claims. The present invention itself, however, and additional objects and advantages thereof will best understood from the following description of embodiments thereof when read in connection with the accompanying drawings, in which:

DETAILED DESCRIPTION OF THE PREFERRED EMBODIMENTS

Below will an embodiment of the present invention be described in reference to the accompanying drawings.

Figure 1:
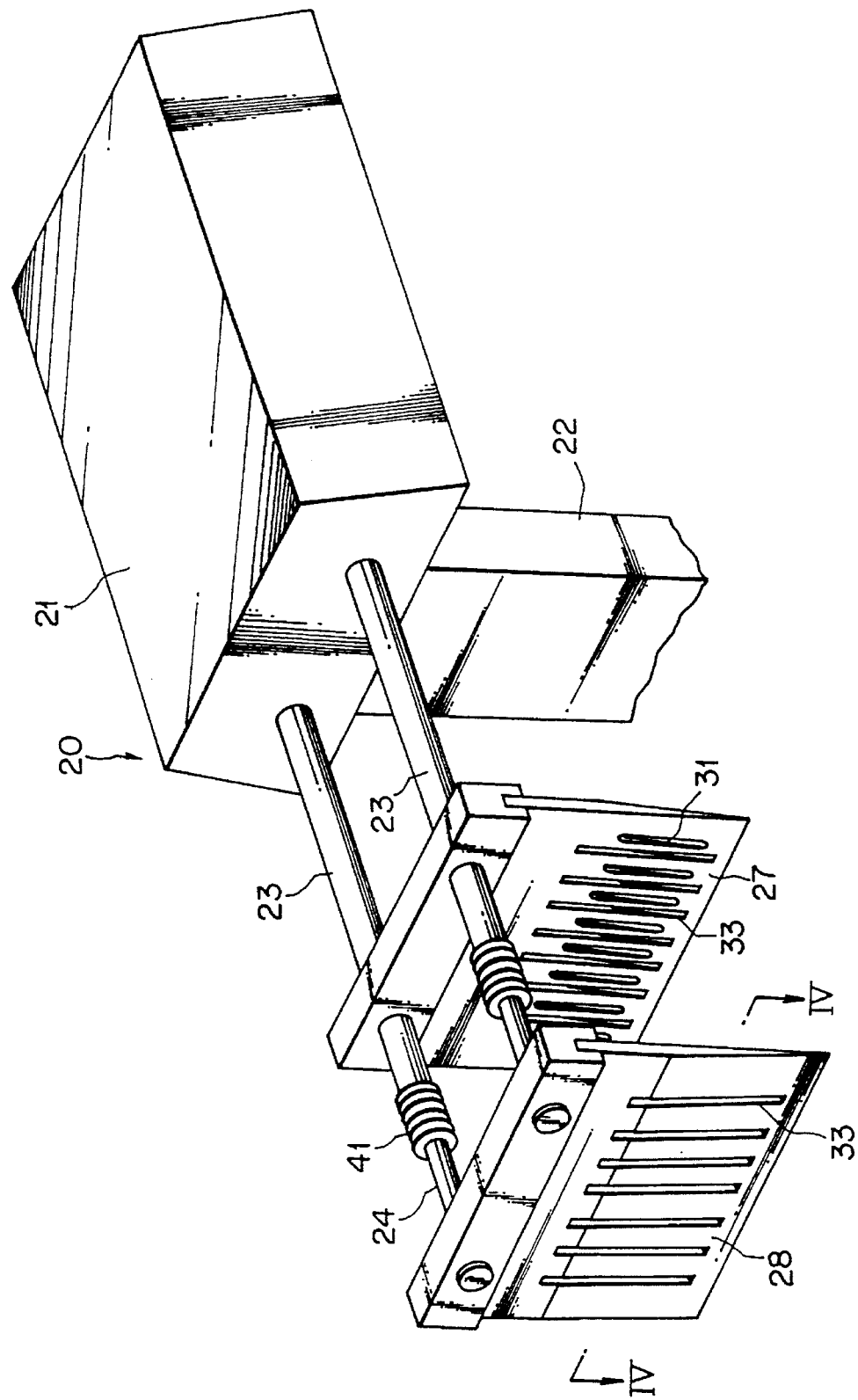
FIG. 1 is a schematic perspective view showing an embodiment of the device for handling wafers according to the present invention.
Figure 2:
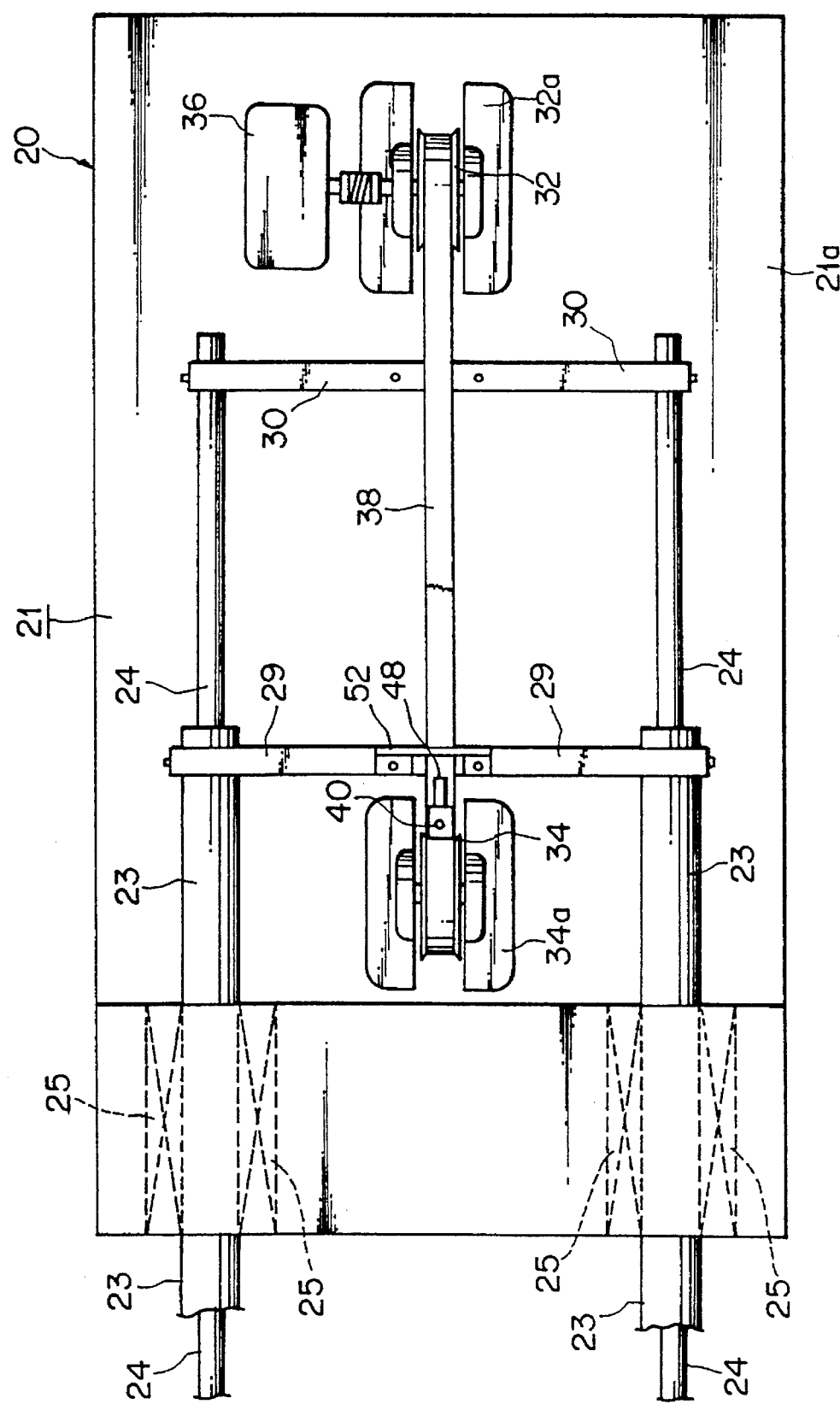
FIG. 2 is a schematic plan view illustrating the drive mechanism of an embodiment of the device for handling wafers according to the present invention.
Figure 3:
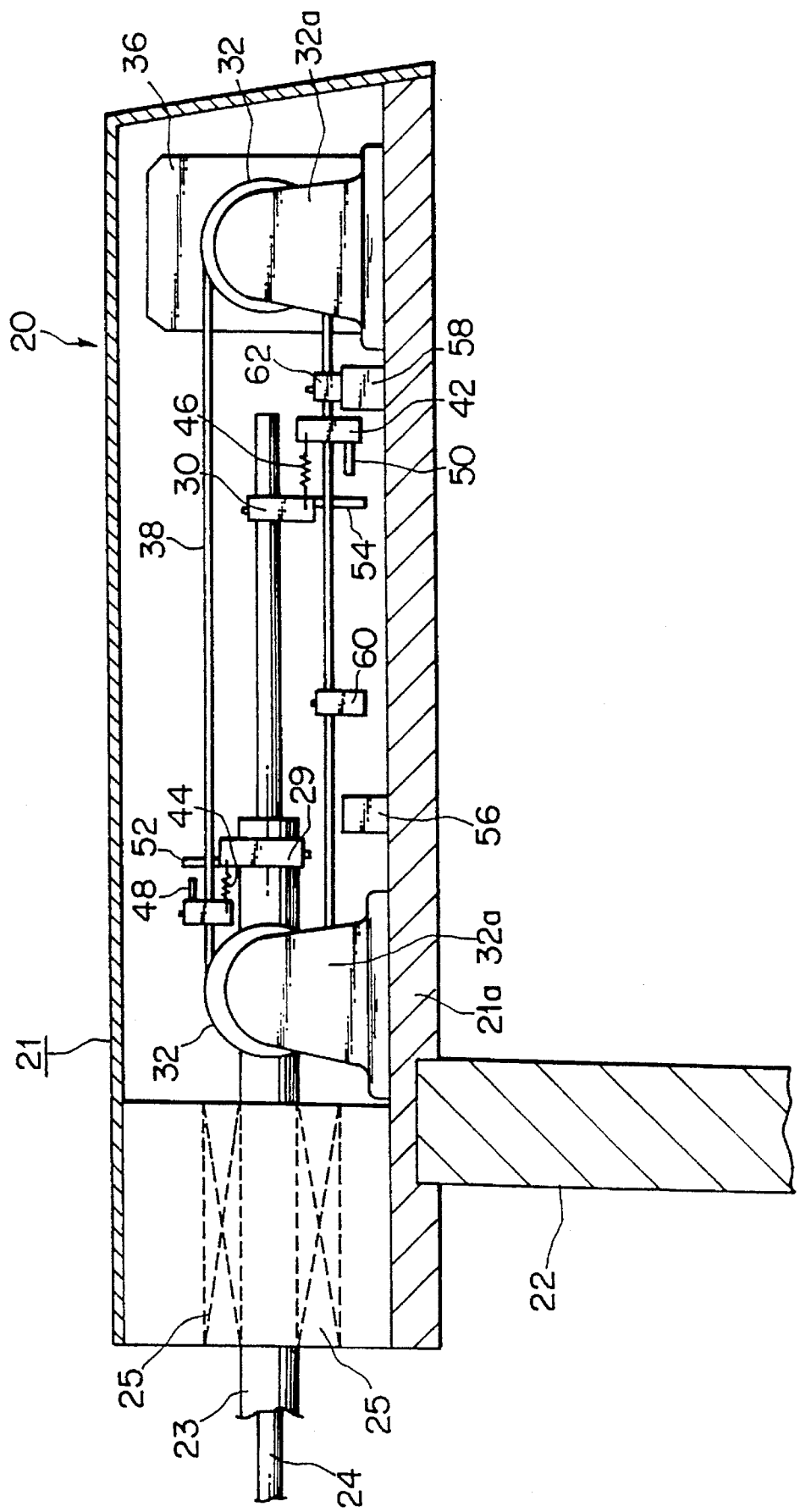
FIG. 3 is a schematic sectional view illustrating the drive means of an embodiment of the device for handling wafers according to the present invention.

FIG. 1 is a schematic perspective view of a device for handling wafers 20 according to the present invention. FIG. 2 is a schematic plan view illustrating the drive mechanism of the device for handling wafers 20. FIG. 3 is a sectional view illustrating the drive mechanism.

In FIG. 1, 21 indicates a base member fixed on the upper end of a shaft 22 freely shiftable upwards or downwards. The base member 21 supports external hollow shafts 23 and internal shafts 24, which shafts form a double shaft structure, where the internal shafts are inserted and freely slidable horizontally inside the external hollow shafts.

The external hollow shafts 23 are supported by respective bearings 25 built in the base member 21 with being freely shiftable horizontally and on the other hand the internal shafts 24 smaller in diameter are respectively inserted inside the external hollow shafts 23 with being freely slidable. Each of handling members 27 and 28 that may handle more than one wafers at a time is vertically held at ends side by side of each pair of the external shafts and the internal shafts and spacing bars 29 and 30 are connected at the other respective pairs of ends of the shafts.

Figure 4:
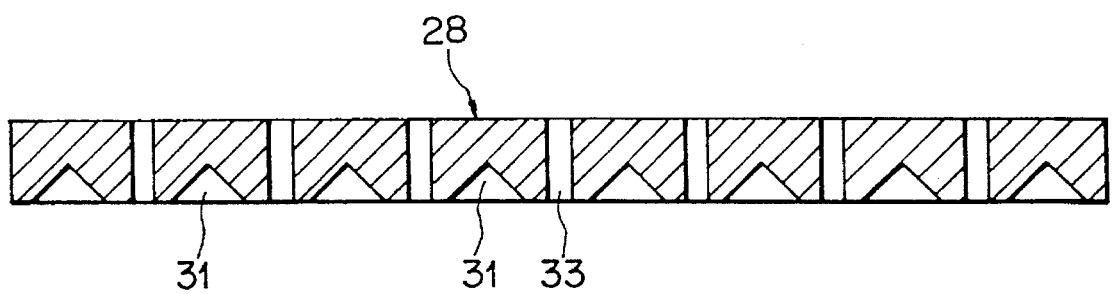
FIG. 4 is a sectional view seen in the direction of the arrows and taken on line IV—IV of FIG. 1.

The handling members 27 and 28 have a shape of a spacious plate as a whole and a plurality of supporting structures 31 for supporting wafers W are provided in the surfaces opposing to each other. The supporting structures 31 each require as a minimal condition a particular detailed shape such that wafers W may be held by touching with at least part of the contour of a wafer periphery. One of the examples are shown as a supporting recesses 31 which are prepared by carving locally in the opposed surfaces as shown in FIGS. 1 and 4.

Figure 5:
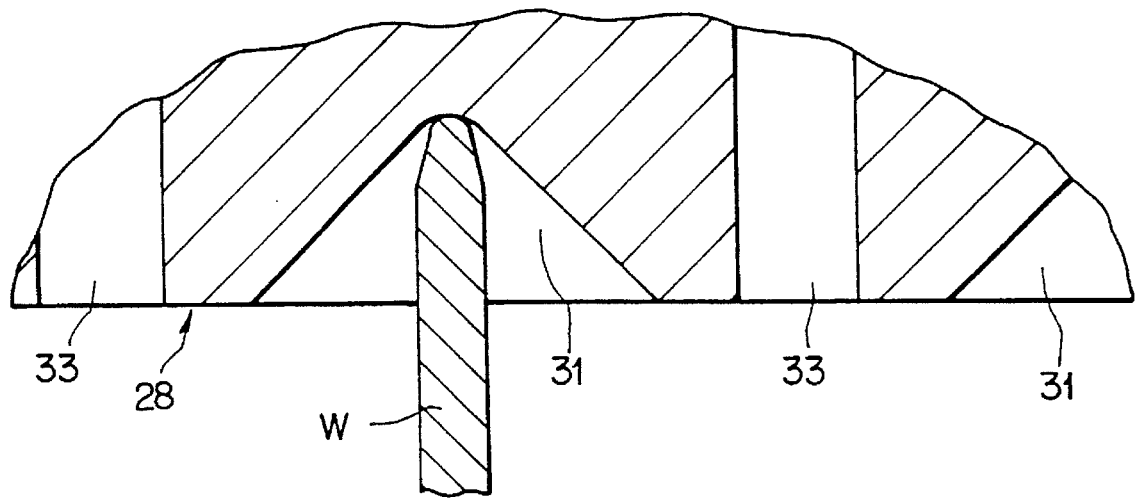
FIG. 5 is a schematic sectional view for illustration showing the supporting condition of a wafer supported by a supporting recess of handling members.
Figure 7:
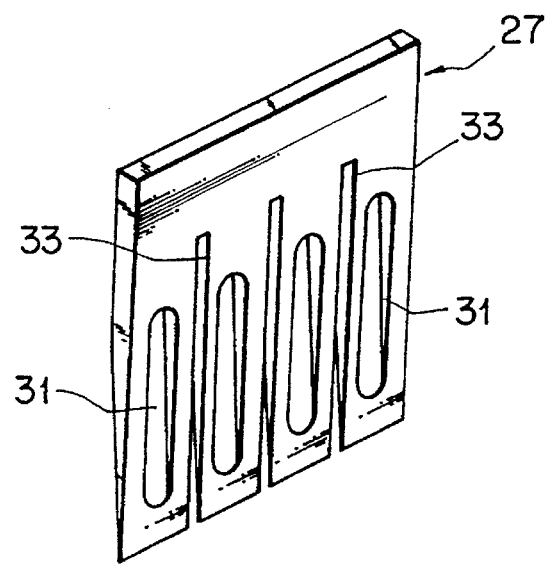
FIG. 7 is a fragmentary perspective view showing still another embodiment of the handling members according to the present invention.

A transverse sectional shape of the supporting recesses 31 is required only to support a wafer by touching on or along the periphery contour and the recesses 31 each as shown as an example in FIG. 5, have the transverse section that the opening is larger in width than the thickness of a wafer W. In this case, an advantage will be enjoyed that the accuracy requirement in positioning both of the handling members 27 and 28 is not very severe. Besides the bottoms of the supporting recesses 31 may be shaped such that they are completely covered with the same substance as that around themselves in such a manner as shown in FIGS. 4 and 5 or such that they are not covered like slit as shown in FIG. 7.

Figure 6:
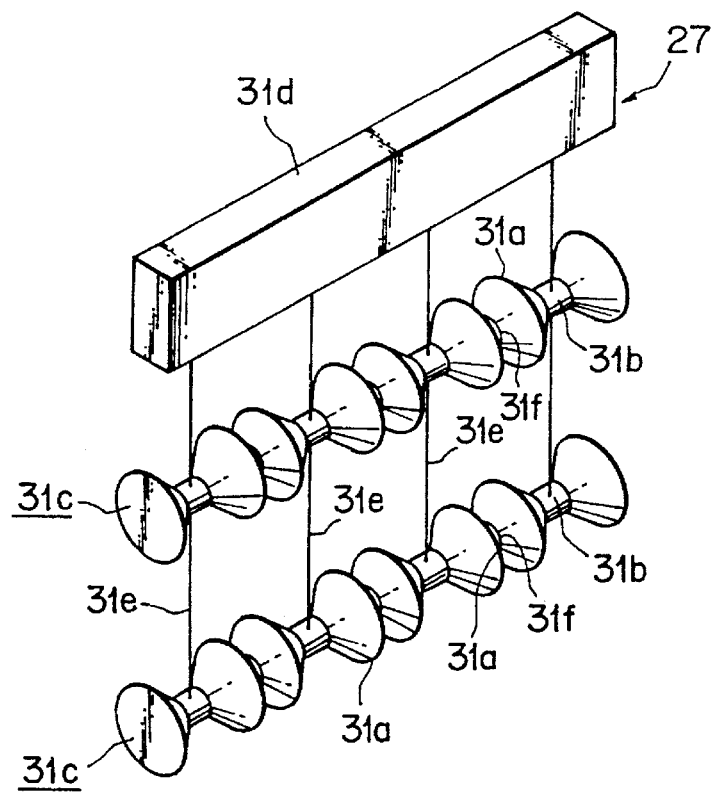
FIG. 6 is a fragmentary perspective view showing another embodiment of the handling members according to the present invention.

Geometrical shapes of the handling members 27 and 28 are not limited to the ones as shown in FIG. 1, but as shown in FIG. 6, a pair of upper and lower supporting members 31c each are a linear alternate combination of larger-diameter members 31a and smaller-diameter members 31b, similar to the shape of an axial successive connection of miniaturized Japanese hand drums. The pair of supporting members 31c are fixedly suspended by a vertically disposed shafts 31e, which are in turn suspended from a supporting bar 31d. The pair of supporting members have as many curved grooves 31f each formed between any pair of the adjacent larger-diameter members as supporting structures.

Adjacent the supporting recesses 31 are opened liquid communicating slits 33 which help to communicate the liquid on both sides, so that the cleaning solution is quick to be displaced from the space between the handling members when the handling members move toward each other, that is, in the respective directions of closing the interval thereof and thereby a phenomenon is advantageously avoided that the cleaning solution therebetween adversely affects the motion of the handling members to slow down. The liquid communicating slits 33 are only to help to displace the solution therebetween directly from the inside to the out side. Consequently the shape as disclosed in FIG. 7 may be adopted, where the slits are particularly formed like in the shape of the teeth of a comb.

As shown in FIG. 2 and 3, the bottom plate 21a of the base member 21 have a pair of pulleys 32 and 34 thereon with bearing plates 32a and 34a therebetween. The pulley 32 is connected to a drive motor 36 through the output shaft and the input shaft. The pulleys 32 and 34 are passed around by a timing belt 38. The reference numeral 41 indicates a set of bellows freely expansible or contractible and the set of bellows 41 is mounted so as to envelope the sliding-out portion of the internal shaft 24 out of the inside of the external shaft 23 without any contact thereof to the exposed surface of the internal shaft 24. The set of bellows 41 works in such a manner that dusts are prevented from falling onto wafers W when they are generated at the sliding portion in action between the internal shaft 24 and the external hollow shaft 23.

The timing belt 38 has an upper block 40 and a lower block 42 fast held thereon. The upper block 40 is connected to the spacing bar 29 for the external hollow shaft 23 by an upper spring 44 therebetween, while the lower block 42 is connected to the spacing bar 30 for the internal shaft 24 by a lower spring 46 therebetween.

The upper and lower springs 44 and 46 work such that the holding condition of wafers W by the handling members 27 and 28 is adjustable. In other words, when the handling members 27 and 28 move toward each other for holding wafers W, the springs 44 and 46 make the motion of the handling members 27 and 28 slow and on the other hand when the members 27 and 28 move away from each other for releasing the wafers W, the springs 44 and 46 give no action against the motion of the handling members 27 and 28, which therefore may move fast.

The reference numeral 48 indicates an upper push pin mounted on the upper block 40 and the reference numeral 50 indicates a lower push pin mounted on the lower block 42. Both of the push pins 48 and 50 push respectively upper and lower receiving strips 52 and 54 mounted on the spacing bars 29 and 30 and thereby the force of the timing belt 38 is in turn transmitted to the external and internal shafts 23 and 24.

The reference numerals 56 and 58 are respectively first and second positioning sensors, which detect first and second objects 60 and 62 fixed on the timing belt 38 for detecting moving limits of the timing belt 38. The drive motor 36 is regulated with the signals from the positioning sensors 56 and 58 so as to adjust the moving distance of the timing belt 38, that is, the interval of the handling members 27 and 28. The locations of the first and second positioning sensors 56 and 58 on the bottom plate 21a are changeable according to different diameters of wafers W and thereby the handling members 27 and 28 are free to handle wafers W of different diameters. Among the means for handling wafers of different diameters, various ideas are available other than the use of the first and second positioning sensors 56 and 58 above mentioned. For example, the moving distance of the timing belt 38 is adjustable by regulating directly the revolution number of the drive motor 36 with a rotary encoder.

In the above mentioned structure, the drive motor 36 is energized to rotate counterclockwise and thereby the timing belt 38 is driven around the pulley 32 to advance in the direction to the left as viewed in FIG. 3. On this occasion, the external and internal shafts 23 and 24 move in their respective opposed directions by the same distance and thereby the handling members 27 and 28 mounted respectively at the exposed ends of each pair of the external and internal shafts 23 and 24 move toward each other. On the other hand, when the drive motor 36 is energized to rotate in the reverse direction, the timing belt 38 moves in the direction to the right as viewed in FIG. 3 and thereby the external and internal shafts 23 and 24 move in their respective opposed directions by the same distance, so that the handling members 27 and 28 move away from each other.

When the handling members 27 and 28 move toward each other, the upper spring 44 and the lower spring 46 act on the handling members 27 and 28 so that the members 27 and 28 may approach to wafers W against the actions of the upper and lower springs 44 and 46 and finally make a soft touch to the peripheries of the wafers W such that the possible shock at the moment of touching is absorbed by the spring actions and therefore the wafers W have no chance to be broken by an excessive force.

On the contrary, when the handling members 27 and 28 move away from each other, the upper push pin 48 pushes the upper receiving strip 52 and at the same time the lower push pin 50 pushes the lower receiving strip 54, so that the handling members 27 and 28 release quickly the wafers W by their swift motion away from each other.

In the embodiment above as an preferred example of a drive mechanism whereby the external and internal shafts 23 and 24 are moved, shown the mechanism comprising of the drive motor 36, the pulleys 32 and 34, the timing belt 38. The essential feature of the mechanism is that the external and internal shafts 23 and 24 always move in their respective opposed directions. Therefore another drive mechanism is conceivable, wherein for example an air cylinder of the prior art as an actuator means of the mechanism is used instead of the drive motor 36.

Figure 8:
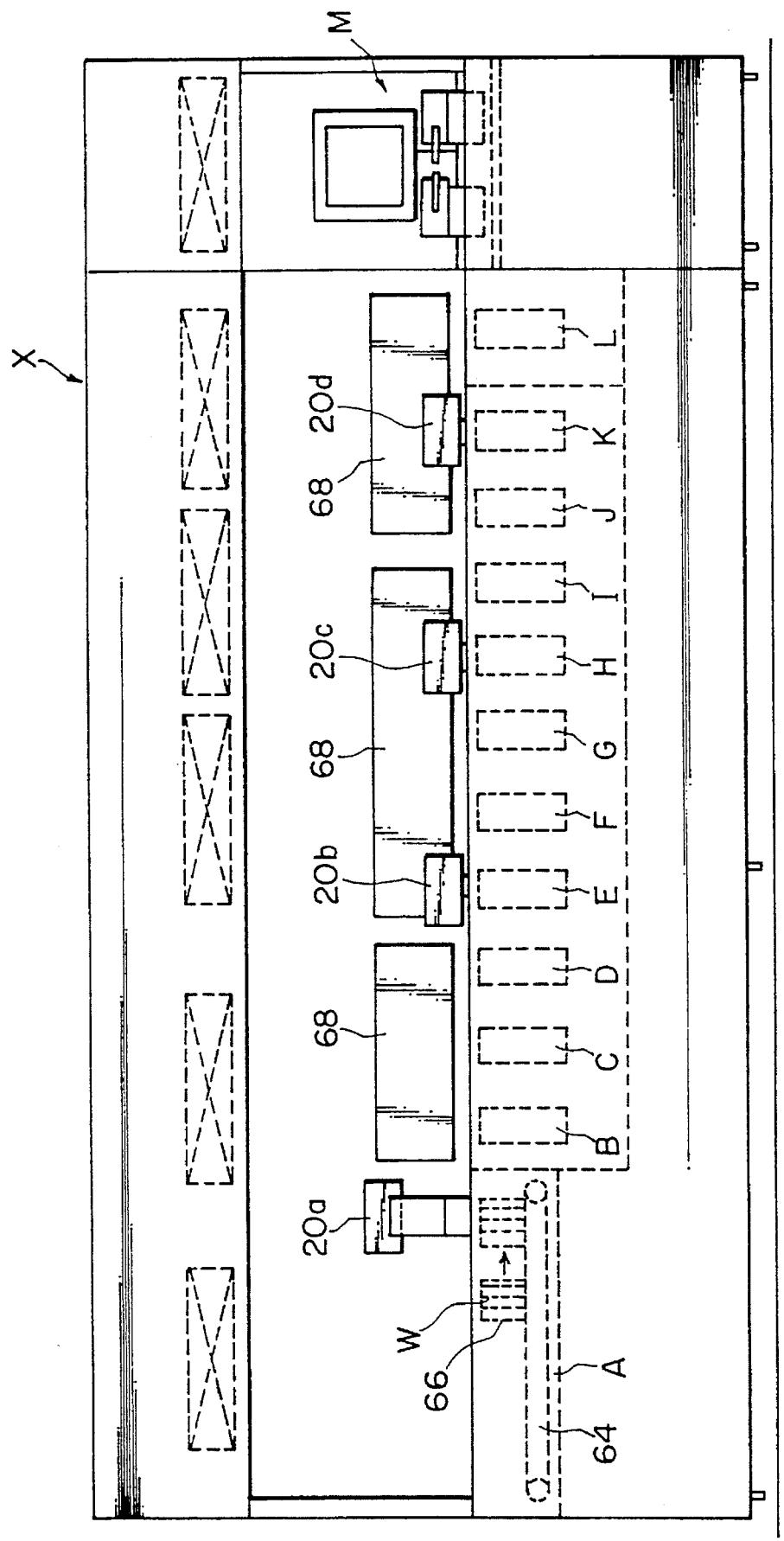
FIG. 8 is an front elevational view of an automatic wafer cleaning apparatus with an embodiment of the device for handling wafers built therein according to the present invention.
Figure 9:
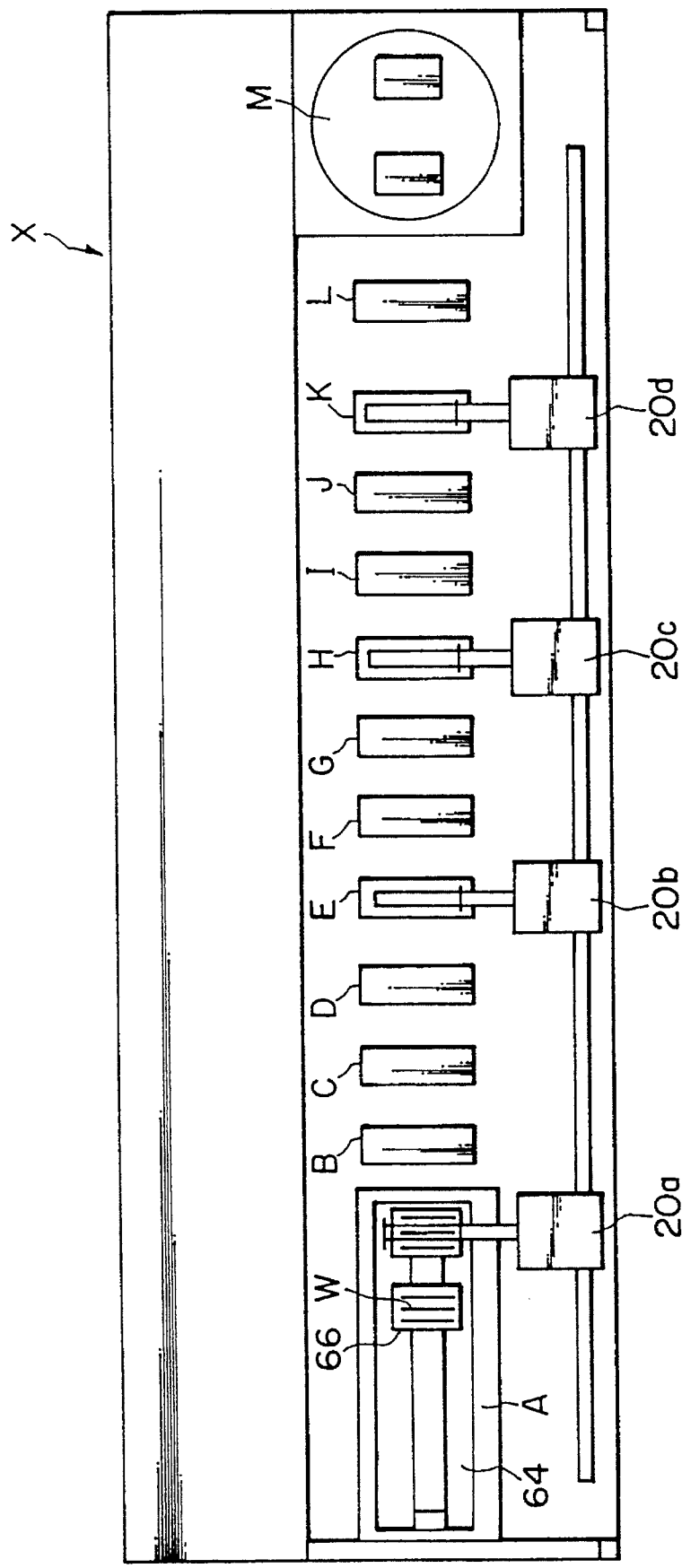
FIG. 9 is the plan view of the apparatus shown in FIG. 8.
Figure 10:
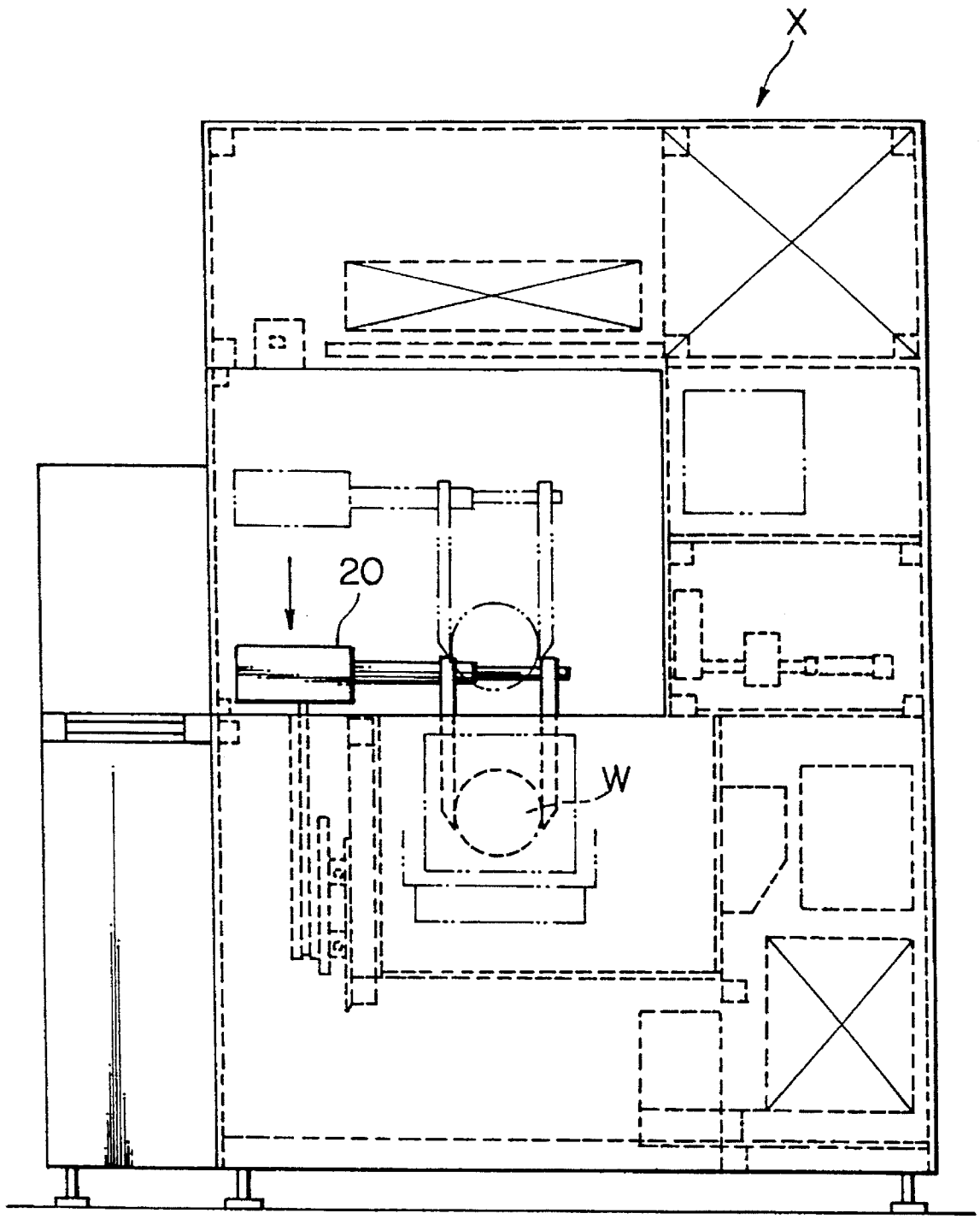
FIG. 10 is the side elevational view of the apparatus shown in FIG. 8.

A brief explanation is given below about wafer cleaning process conducted by an automatic wafer cleaning apparatus equipped with a device for handling wafers 20 according to the present invention. FIGS. 8, 9 and 10 are respectively a front elevational view, a plan view and a side elevational view of an automatic wafer cleaning apparatus equipped with devices for handling wafers 20a to 20b, where the automatic wafer cleaning apparatus X consists of a loader section A. cleaning baths B to K, a dryer L and an unloader section M.

Wafers which have been polished across the surface in the preceding polishing step are consecutively transferred by a belt conveyor 64 to the loader section A in cassettes 66, where the wafers contained are treated as a batch. The belt conveyor 64 composes a part of the loader section A. The wafers W in a cassette 66 are lifted at the end of the belt conveyor 64 in the loader section A to a raised position by pushing of the bottoms upwards by a device not shown and the raised wafers W are then held fast by the closed handling members 27 and 28 of a device for handling wafers 20a, when the wafers W are kept positioned vertically as they were previously.

The thus vertically held wafers W by a device for handling wafers 20a are consecutively immersed to be washed in the respective cleaning solutions contained in the cleaning baths B to D one after another and further the wafers W are respectively immersed in the cleaning solutions contained in the cleaning baths E to G again one after another with another device for handling wafers 20b, and still further in a similar manner to the above operations with further devices for handling wafers 20c and 20d the wafers W are automatically transferred through the cleaning baths H to K, the dryer L and then the unloader section M one after another, as a whole to be treated properly in the respective sections of the apparatus, so that a series of relevant cleaning operations to be acted on the wafers w are completed. In the meantime, the reference numeral 68 shown in FIG. 8 indicates observation ports for observing the operations being conducted inside the apparatus.

What is claimed is:

1. A device for handling wafers which comprises:

external hollow shafts supported horizontally and freely movable in an axial direction;

internal shafts inserted and freely slidable within the external hollow shafts;

a pair of handling members, one of the pair of handling members being supported by adjacent first ends of the external hollow shafts and another of said pair of handling members being supported by adjacent first ends of the internal shafts, said pair of handling members having respective surfaces which are opposed to each other;

a drive mechanism for moving the external hollow shafts and the internal shafts along the axial direction; and a plurality of supporting structures provided in the respective opposed surfaces of the handling members, wherein the drive mechanism comprises:

a pair of spacing bars, one of the pair of spacing bars being supported by adjacent second ends of the external hollow shafts and another of said pair of spacing bars being supported by adjacent second ends of the internal shafts;

a timing belt passing around pulleys fixed on a bottom plate of a base member;

a drive means for driving the timing belt;

an upper block having an upper push pin and an upper spring, and a lower block having a lower push pin and a lower spring;

the upper and lower springs connecting the upper and lower blocks and the pair of spacing bars respectively;

positioning sensors placed on the bottom plate of the base member; and objects fixed on the timing belt for detection by the positioning sensors.

2. A device for handling wafers of claim 1, wherein the handling members comprise plate-shaped structures and include a plurality of supporting recesses as the supporting structures which are carved on the opposed surfaces thereof, and liquid communicating slits which are provided adjacent each of the supporting recesses.

3. A device for handling wafers of claim 2, wherein movement of the external hollow shafts and the internal shafts is adjustable so as to hold wafers of different diameters.

4. A device for handling wafers of claim 1, wherein the supporting members comprise a pair of upper and lower linear alternate combinations of larger-diameter members and smaller-diameter members, the supporting members being spaced apart and fixedly suspended by vertically disposed shafts.

5. A device for handling wafers of claim 4, wherein movement of the external hollow shafts and the internal shafts is adjustable so as to hold wafers of different diameters.

6. A device for handling wafers of claim 1, wherein movement of the external hollow shafts and the internal shafts is adjustable so as to hold wafers of different diameters.

7. A device for handling wafers which comprises:

external hollow shafts supported horizontally and freely movable in an axial direction;

internal shafts inserted and freely slidable within the external hollow shafts;

a pair of handling members, one of the pair of handling members being supported by adjacent first ends of the external hollow shafts and another of said pair of handling members being supported by adjacent first ends of the internal shafts, said pair of handling members having respective surfaces which are opposed to each other;

a drive mechanism for moving the external hollow shafts and the internal shafts in opposite distances along the axial direction, said opposite distances being equal; and a plurality of supporting structures provided in the respective opposed surfaces of the handling members, wherein the drive mechanism comprises:

a pair of spacing bars, one of the pair of spacing bars being supported by adjacent second ends of the external hollow shafts and another of said pair of spacing bars being supported by adjacent second ends of the internal shafts;

a timing belt passing around pulleys fixed on a bottom plate of a base member;

a drive means for driving the timing belt;

an upper block having an upper push pin and an upper spring, and a lower block having a lower push pin and a lower spring;

the upper and lower springs connecting the upper and lower blocks and the pair of spacing bars respectively;

positioning sensors placed on the bottom plate of the base member; and objects fixed on the timing belt for detection by the positioning sensors.

8. A device for handling wafers of claim 7, wherein the handling members comprise plate-shaped structures and include a plurality of supporting recesses as the supporting structures which are carved on the opposed surfaces thereof, and liquid communicating slits which are provided adjacent each of the supporting recesses.

9. A device for handling wafers of claim 8, wherein movement of the external hollow shafts and the internal shafts is adjustable so as to hold wafers of different diameters.

10. A device for handling wafers of claim 7, wherein the supporting members comprise a pair of upper and lower linear alternate combinations of larger-diameter members and smaller-diameter members, the supporting members being spaced apart and fixedly suspended by vertically disposed shafts.

11. A device for handling wafers of claim 10, wherein movement of the external hollow shafts and the internal shafts is adjustable so as to hold wafers of different diameters.

12. A device for handling wafers of claim 7, wherein movement of the external hollow shafts and the internal shafts is adjustable so as to hold wafers of different diameters.

13. A device for handling wafers which comprises:

external hollow shafts supported horizontally and freely movable in an axial direction;

internal shafts inserted and freely slidable within the external hollow shafts;

a pair of handling members, one of the pair of handling members being supported by adjacent ends of the external hollow shafts and another of said pair of handling members being supported by adjacent ends of the internal shafts, said pair of handling members having respective surfaces which are opposed to each other;

a drive mechanism for moving the external hollow shafts and the internal shafts along the axial direction; and a plurality of supporting structures provided in the respective opposed surfaces of the handling members, wherein the handling members comprise plate-shaped structures and include a plurality of supporting recesses as the supporting structures which are carved on the opposed surfaces thereof, and liquid communicating slits which are provided adjacent each of the supporting recesses.

14. A device for handling wafers of claim 13, wherein movement of the external hollow shafts and the internal shafts is adjustable so as to hold wafers of different diameters.

15. A device for handling wafers of claim 13, further comprising a cover which connects between the external hollow shafts and the internal shafts so as to envelop a junction therebetween.

16. A device for handling wafers of claim 15, wherein said cover comprises a bellows.

17. A device for handling wafers which comprises:

external hollow shafts supported horizontally and freely movable in an axial direction;

internal shafts inserted and freely slidable within the external hollow shafts;

a pair of handling members, one of the pair of handling members being supported by adjacent ends of the external hollow shafts and another of said pair of handling members being supported by adjacent ends of the internal shafts, said pair of handling members having respective surfaces which are opposed to each other;

a drive mechanism for moving the external hollow shafts and the internal shafts in opposite distances along the axial direction, said opposite distances being equal and a plurality of supporting structures provided in the respective opposed surfaces of the handling members, wherein the handling members comprise plate-shaped structures and include a plurality of supporting recesses as the supporting structures which are carved on the opposed surfaces thereof, and liquid communicating slits which are provided adjacent each of the supporting recesses.

18. A device for handling wafers of claim 17, wherein movement of the external hollow shafts and the internal shafts is adjustable so as to hold wafers of different diameters.

19. A device for handling wafers of claim 17, further comprising a cover which connects between the external hollow shafts and the internal shafts so as to envelop a junction therebetween.

20. A device for handling wafers of claim 19, wherein said cover comprises a bellows.

21. A device for handling wafers which comprises:

external hollow shafts supported horizontally and freely movable in an axial direction;

internal shafts inserted and freely slidable within the external hollow shafts;

a pair of handling members, one of the pair of handling members being supported by adjacent ends of the external hollow shafts and another of said pair of handling members being supported by adjacent ends of the internal shafts, said pair of handling members having respective surfaces which are opposed to each other;

a drive mechanism for moving the external hollow shafts and the internal shafts along the axial direction; and a plurality of supporting structures provided in the respective opposed surfaces of the handling members, wherein the supporting members comprise a pair of upper and lower linear alternate combinations of larger-diameter members and smaller-diameter members, the supporting members being spaced apart and fixedly suspended by vertically disposed shafts.

22. A device for handling wafers of claim 21, wherein movement of the external hollow shafts and the internal shafts is adjustable so as to hold wafers of different diameters.

23. A device for handling wafers which comprises:

external hollow shafts supported horizontally and freely movable in an axial direction;

internal shafts inserted and freely slidable within the external hollow shafts;

a pair of handling members, one of the pair of handling members being supported by adjacent ends of the external hollow shafts and another of said pair of handling members being supported by adjacent ends of the internal shafts, said pair of handling members having respective surfaces which are opposed to each other;

a drive mechanism for moving the external hollow shafts and the internal shafts in opposite distances along the axial direction, said opposite distances being equal; and a plurality of supporting structures provided in the respective opposed surfaces of the handling members, wherein the supporting members comprise a pair of upper and lower linear alternate combinations of larger-diameter members and smaller-diameter members, the supporting members being spaced apart and fixedly suspended by vertically disposed shafts.

24. A device for handling wafers of claim 23, wherein movement of the external hollow shafts and the internal shafts is adjustable so as to hold wafers of different diameters.

* * * * *